(12) United States Patent
Smit

(10) Patent No.: US 8,718,959 B2
(45) Date of Patent: May 6, 2014

(54) METHOD AND APPARATUS FOR HIGH-SPEED FAULT DETECTION IN DISTRIBUTION SYSTEMS

(75) Inventor: Andre Smit, Raleigh, NC (US)

(73) Assignee: Siemens Industry, Inc., Alpharetta, GA (US)

( * ) Notice: Subject to any disclaimer, the term of this patent is extended or adjusted under 35 U.S.C. 154(b) by 733 days.

(21) Appl. No.: 12/967,191

(22) Filed: Dec. 14, 2010

(65) Prior Publication Data

US 2011/0144931 A1 Jun. 16, 2011

Related U.S. Application Data

(60) Provisional application No. 61/286,574, filed on Dec. 15, 2009.

(51) Int. Cl.
*G01R 31/08* (2006.01)
*H02H 7/26* (2006.01)

(52) U.S. Cl.
CPC .............. *H02H 7/261* (2013.01); *G01R 31/085* (2013.01); *G01R 31/086* (2013.01)
USPC ............... 702/59; 702/58; 700/292; 700/293; 700/294

(58) Field of Classification Search
CPC ..... H02H 7/261; G01R 31/085; G01R 31/086
USPC ........................ 702/58, 59; 700/292, 293, 294
See application file for complete search history.

(56) References Cited

U.S. PATENT DOCUMENTS

| | | | | |
|---|---|---|---|---|
| 5,943,202 | A * | 8/1999 | Beckwith | 361/66 |
| 6,405,104 | B1 * | 6/2002 | Dougherty | 700/292 |
| 6,591,375 | B1 * | 7/2003 | Hu | 714/25 |
| 6,603,649 | B1 | 8/2003 | Muller et al. | |
| 6,687,573 | B2 | 2/2004 | Egolf et al. | |
| 7,489,138 | B2 * | 2/2009 | Yu et al. | 324/536 |
| 7,636,616 | B2 | 12/2009 | Fletcher et al. | |
| 7,751,166 | B2 * | 7/2010 | Stoupis et al. | 361/64 |
| 7,773,360 | B2 | 8/2010 | O'Leary et al. | |
| 2006/0193099 | A1 * | 8/2006 | Schweitzer et al. | 361/115 |
| 2007/0147415 | A1 * | 6/2007 | Marusca et al. | 370/465 |
| 2008/0024142 | A1 | 1/2008 | Opfer et al. | |
| 2009/0204347 | A1 * | 8/2009 | Nowicki et al. | 702/58 |
| 2009/0290275 | A1 | 11/2009 | Staszesky et al. | |
| 2010/0204948 | A1 * | 8/2010 | Kirrmann et al. | 702/117 |
| 2011/0188159 | A1 * | 8/2011 | Su et al. | 361/38 |

* cited by examiner

*Primary Examiner* — John Breene
*Assistant Examiner* — Timothy H Hwang

(57) ABSTRACT

A method and apparatus for high-speed fault detection of circuits in power distribution networks utilizing protective relay devices (14) segmenting a distribution line (11) having Intelligent Electronic Devices (IED) (22) associated with switching devices (20) communicating peer-to-peer via a communication system (30) to provide fast and accurate fault location information in distribution systems.

20 Claims, 2 Drawing Sheets

METHOD AND APPARATUS FOR HIGH-SPEED FAULT DETECTION IN DISTRIBUTION SYSTEMS

This application claims benefit of the 15 Dec. 2009 filing date of U.S. provisional patent application 61/286,574 which is incorporated by reference herein.

FIELD OF THE INVENTION

This invention relates to distribution systems and more particularly to a method and apparatus for high-speed fault detection of circuits in power distribution networks using peer-to-peer communication.

BACKGROUND OF THE INVENTION

Protection of power distribution systems involves detecting, locating and initiating the removal of a fault from the power system. Identifying the location of faults is an important process. Protective relays are extensively used for major protective functions. Protection systems and circuit breakers are installed at strategic locations along the feeder for the purpose of detecting faults that cause excess current to flow and to automatically disconnect them from the source. Manual operations are usually required to isolate the faulty section and this can take several hours during which time many customers are without electricity.

Time grading techniques are often used to minimize the number of customers disconnected when isolating a fault. Time graded protective systems have protective devices in successive zones that are arranged to operate in times which are graded through the sequence of equipment so that upon the occurrence of a fault only those relevant to the faulty zone complete the tripping function. A disadvantage of time grading schemes is that they are slow to identify faulted zones and due to the time separation required and it is assumption that there is a single source feeding the system. This method is not suitable when dealing with multiple variable sources like wind and solar generation and will require continual adaptive setting changes in real time.

A number of systems exist dealing with fault detection of circuits in power distribution networks such as those described in U.S. Pat. Nos. 6,603,649; 6,687,573; 7,636,616; 7,773,360; 2008/0024142; and 2009/0290275, all of which are incorporated herein by reference.

There is a need in the art for a scheme that can clearly detect a faulted zone in a shorter time and with less impact on the connected power grid and that is also immune to the effect of the introduction of distributed generation in distribution feeder networks. The present invention addresses those needs.

SUMMARY OF THE INVENTION

Broadly speaking, the invention provides a method and apparatus for high-speed fault detection of circuits (e.g., circuit breakers switches, reclosers, isolators) in power distribution feeder networks. The method and system allows for self-detecting, self-isolating, and automatic restoration using self-managed cells of primary switch devices.

In an embodiment of the present invention, protective relay devices are associated with automatic switches/reclosers, such as in an overlapping zone of protection configuration, where the protective relay devices include microprocessors and may be referred to as Intelligent Electronic Devices (IED). Such microprocessors may comprise, for example, programmable logic controllers (PLCs) for the associated control design. A high speed communication system (such as fiber link, WiMax, WiFi, or other wired or wireless carrier technologies or a mix thereof) is provided between the protective relay devices for peer-to-peer communication. The protective relay devices are capable of exchanging messages, for example, GOOSE (Generic Object Oriented Substation Event) messages under the IEC61850 Standard. The protective relay devices are then adapted to test for faults in a unique manner and communicate with each other to provide fast and accurate fault location information in distribution feeder systems.

The invention can be implemented in numerous ways, including as a system, a device/apparatus, a method, or a computer readable medium. Several embodiments of the invention are discussed below.

As a method, the invention comprises testing using differential equations between protective devices for faults. First, a local RMS value of the positive sequence $I_1$ current is subtracted from upstream RMS value of the positive sequence current and given a value (e.g., 1 or 0) based on a measured minimum positive sequence current setting. GOOSE messages may be used to distribute RMS values. Then, the results from both line ends are then added to form a result at each point (Binary values are used). Finally, the results are then added again at each point to form the final local result wherein a binary 1 or high will indicate a faulted zone. In addition the RMS value for each phase current is checked to detect a suddenly increase or decrease in the measured current. An increase in measured RMS phase current will lead to a positive count and a negative jump will lead to a negative count. Each jump will be transmitted for a set period from each device. A negative count on one device and the positive count on the other device, measuring the same phases current quantity, will then lead to a positive differential detection between the two devices in the system and can be set to detect multiple steps in a positive or negative direction for added stability. This method will allow indication of a faulted zone within a 200 msec time frame for a wireless network and 100 msec for copper of fibers communication networks. As communication and IEC61850 implementations improve the tripping time will be able to produce tripping times with in 50 msec.

The methods of the present invention may be implemented as a computer program product with a computer-readable medium having code thereon.

As an apparatus, the present invention may include microprocessor-based protective devices or RTU's or PLC' programmed in accordance with the steps of the present invention.

Accordingly, an advantage of the present invention is that the method can clearly detect a faulted zone in a shorter time with less impact on the connected power grid that is immune system impedance and source variations.

Other aspects and advantages of the invention will become apparent from the following detailed description taken in conjunction with the accompanying drawings, illustrating, by way of example, the principles of the invention.

All patents, patent applications, provisional applications, and publications referred to or cited herein, or from which a claim for benefit of priority has been made, are incorporated herein by reference in their entirety to the extent they are not inconsistent with the explicit teachings of this specification.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Broadly speaking, the invention provides a method and apparatus for high-speed fault detection of circuits in power distribution networks utilizing Intelligent Electronic Devices (IED) associated with switching devices communicating peer-to-peer to provide fast and accurate fault location information in feeder distribution systems over wireless communication networks.

Figure 1:
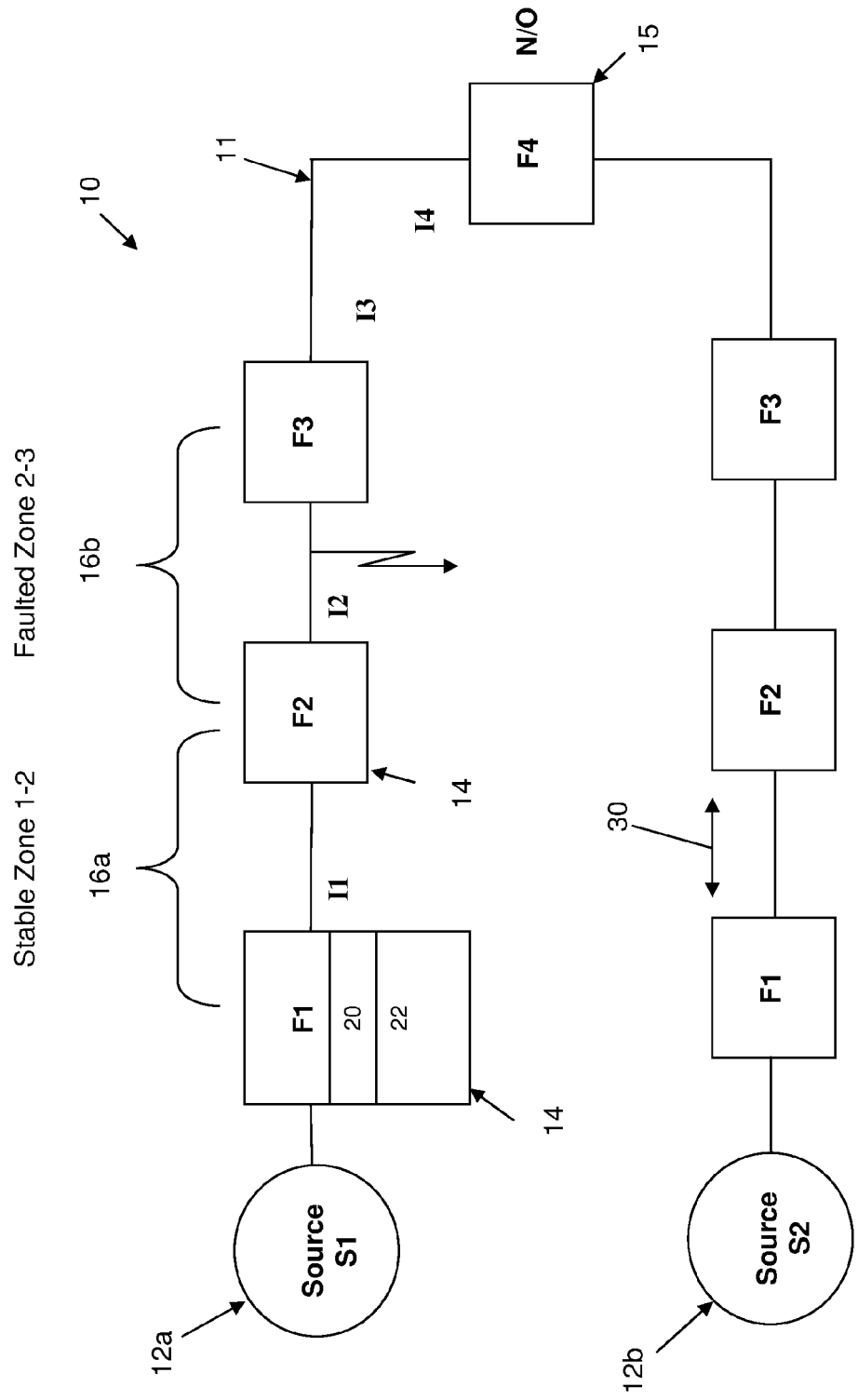
FIG. 1 is a block diagram of an embodiment of the invention.

FIG. 1 shows a simplified view of a portion of an exemplary electrical power distribution system 10 that includes fault protection devices 14 (F1, F2, F3 . . . ). Generally, in such an arrangement, a source 12a (S1) is coupled to a distribution line 11 along with an alternate source 12b (S2) coupled to the distribution line 11 by a normally open device 15 (N/O) and fault protection devices 14 (F1, F2, F3 . . . ) segment the distribution line 11 into segments/zones 16a, 16b (Zone 1-2, Zone 2-3, etc.). In this example, the distribution system 10 comprises a plurality of sources 12a, 12b of electrical power, shown herein as sources S1, S2 connected to a plurality of users or loads (e.g., factories, homes, etc., not shown) through an electrical distribution line 11 such as conventional electrical power lines. Distribution line 11 has a plurality of fault protection devices/protective relay devices 14 (individually labeled F1, F2, . . . FN) placed at predetermined points along the line, including for example a normally open N/O switch F4 in this particular arrangement. The depiction of the number and arrangement of sources, users, lines and devices in FIG. 1 is arbitrary and there may be many different configurations and virtually any number of each of these components in any given distribution system.

The protective relay devices 14 are associated with automatic switches/reclosers 20 (e.g., a group of reclosers, switches, or a combination of both, within a loop), such as in an overlapping zone of protection configuration. The protective relay herein preferably comprises microprocessor based devices such as an Intelligent Electronic Devices 22 (IEDs—any device incorporating one or more processors with the capability to receive or send data/control from or to an external source) having a programmable logic controller (PLC) and a communication processor and protocol such as an IEC 61850 (open standard as a part of the International Electrotechnical Commission's (IEC) Technical Committee 57 (TC57) reference architecture for electric power systems) communication processor. The PLC of the IED 22 mainly comprises a CPU, memory areas, and appropriate circuits to receive input/output data. The processors in the protective devices perform certain logical tasks based on their programming. Numerous input terminals receive inputted logical states from sensors and switches (e.g., "0"/"1", or "on"/"off") . Output terminals initiate events such as to trip a circuit. Protective relays 14 are devices that are used as a sensing element to detect abnormal conditions in the distribution system. An automatic circuit recloser 20 is a self-contained device which can sense and interrupt fault currents as well as re-close automatically in an attempt to re-energize a line.

The protective relay device 14 communicates with current and voltage sensors, or voltage transformers (VTs) and current transformers (CTs), not shown, to monitor the flow of power. The current and voltage sensors provide the necessary input of data used to determine logic sequences in fault detection. The loop generally can contain 3-20 switching devices within one group of devices or loop. A typical feeder has 7-10 switching stations.

A high speed communication system 30 (such as fiber link, WiMax, WiFi, or other wired or wireless carrier technologies or a mix thereof) is provided between the devices for peer-to-peer communication. Information is then made available to each of the other intelligent devices, over the communications channel located within that particular loop. For example, an Ethernet backbone can be linked over a twisted pair type copper cable, fiber or an Internet protocol (IP)-based radio system, broadband over power line (BPL) or digital subscriber line (DSL). The devices 14 are capable of exchanging messages, for example, GOOSE (Generic Object Oriented Substation Event) messages under the IEC61850 Standard (These protocols can run over TCP/IP networks and/or substation LANs using high speed switched Ethernet to obtain the necessary response times of <4 ms for protective relaying.). Peer-to-peer functionality via IEC 61850 generic-object-oriented substation event (GOOSE) messages provides not only binary data, but analog values as well. There is thus no need for a master-slave arrangement since IEC 61850 provides peer-to-peer communications capability. Since the devices all communicate in a peer-to-peer manner, some of the input devices that would normally be required in a loop-automation system can be eliminated.

The devices 14 are configured to test for faults using differential protection (i.e., electrical quantities entering and leaving the protected zone are compared and if the net is zero, it is assumed no fault exists) and communicate with each other to provide fast and accurate fault location information in distribution systems.

The self healing logic may reside in the individual intelligent electric device (IED) groups located in the feeder loops. The IEDs 22 handle the self-healing functionality and attempt to clear faults, isolate and then, after the fault is removed, initiate the restoration logic. Fault location information is processed in seconds with differential equations using peer-to-peer communications between switching points. The system performs the functions of fault detection, isolation and restoration (FDIR) with decentralized automation. The individual self-healing loop breaks the grid into manageable segments and allows the utility to further define the healing process logic for its distribution system.

Figure 2:
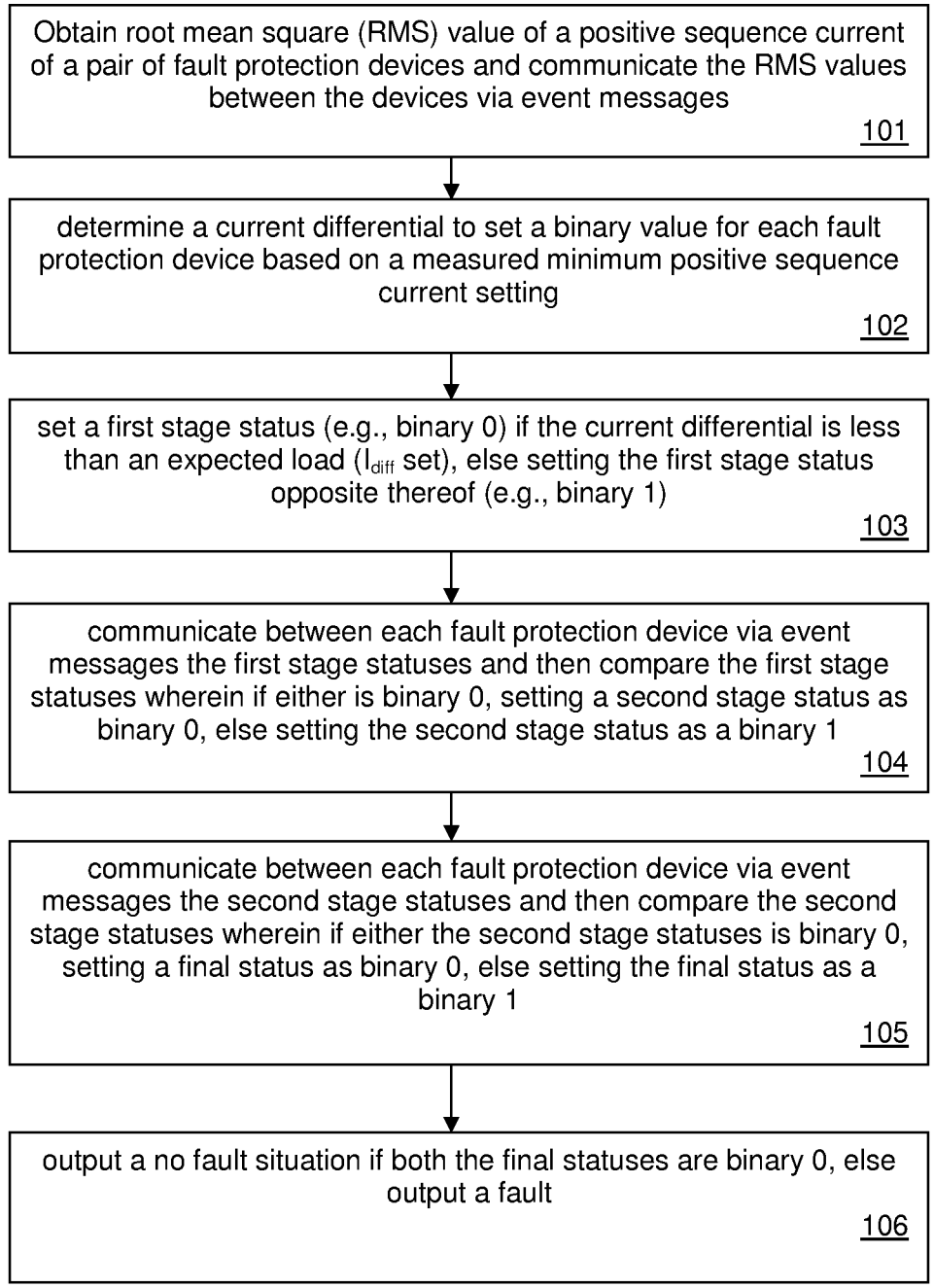
FIG. 2 is a flow chart showing the steps of an embodiment of the invention.

Referring to FIG. 2, the testing method used herein for faults essentially comprises three stages. The method detects faults in a power distribution system 10 having at least one source 12a coupled to a distribution line 11 comprising a plurality of fault protection devices 14 segmenting the distribution line 11 into a plurality of protected zones 16a, 16b, the fault protection devices 14 having processing and communication capabilities and associated with switching devices 20. In the method, for each protected zone 16a, 16b defined by a pair of fault protection devices 14 on either end, a first local fault protection device 14 (F1) on a first end and a second remote fault protection device 14 (F2) on a second end, the steps include STEP 1 (101) receiving as input a local root mean square (RMS) value of a positive sequence current $I_1$ of the first local fault protection device and a remote RMS value of the positive sequence current $I_2$ of the second remote fault protection device, wherein the RMS values are communicated between the fault protection devices via event messages; STEP 2 (102) determining for each fault protection device of the pair a current differential between current $I_1$ and current $I_2$ to set a binary value for each fault protection device of the pair based on a measured minimum positive sequence current setting; STEP 3 (103) setting individually for each fault protection device a first stage status of binary 0 if the current differential is less than an expected load ($I_{diff}$ set) in this zone, else setting the first stage status as a binary 1; STEP 4 (104) communicating between each fault protection device via event messages the first stage statuses and then comparing the first stage statuses wherein if either fault protection device has the first stage status of binary 0, setting individually for each fault protection device a second stage status as binary 0, else setting the second stage status as a binary 1; STEP 5 (105) communicating between each fault protection device via event messages the second stage statuses and then comparing the second stage statuses wherein if either fault protection device has the second stage status of binary 0, setting individually for each fault protection device a final status as binary 0, else setting the final status as a binary 1; and STEP 6 (106) indicating a no fault situation if both the final statuses are binary 0, else indicating a fault. Other embodiments are variations of these steps as shown in the following tables.

These steps are essentially executed in three stages. At stage 1, local RMS value of the positive sequence $I_1$ current is subtracted from upstream RMS value of the positive sequence current and given a value (e.g., 1 or 0) based on a measured minimum positive sequence current setting. GOOSE messages may be used to distribute RMS values. In addition the positive and negative jump associated with the individual phase currents or positive sequence currents caused by a fault will be detected and shared and can be used as a AND or OR function throughout the remaining stages.

At Stage 2, the results from both line ends are then added and compared to form a result at each point. Binary values are used.

At Stage 3, the results from Stage 2 are then added and compared again at each point to form the final local result wherein a binary 1 or high will indicate a faulted zone. This method will allow indication of a faulted zone within a 200 msec time frame over a wireless communication network.

For a stable zone as between F1 and F2 in FIG. 1 and with reference to FIG. 2, the following tables represent the sequence of steps:

TABLE 1a

| Stable Zone 1-2 (Note: >> indicates a GOOSE value PU = per unit) | | |
|---|---|---|
| Stage | F1 | F2 |
| Stage 1 (RMS value of the Zero sequence current used) | $I_{diff}$ for F1-2 = I1->>I2 = (1PU − 1PU) > Idiff set = 0 | $I_{diff}$ for F2-1 = I2->>I1 = (1PU − 1PU) > Idiff set = 0 |
| Stage 2 (binary 1 or 0) | F1-2 AND >>F2-1 = 0 AND >>0 = 0 (no fault) | F2-1 AND >>F1-2 = 0 AND >>0 = 0 (no fault) |
| Stage 3 (binary 1 or 0) | Faulted Zone = 0 AND >>0 = 0 (1 = Fault) | Faulted Zone = 0 AND >>0 = 0 (1 = Fault) |

Table 1a Description:

This table describes the how the IED's will react to a fault outside the zone of protection. In this instance the current measured in both devices will increase at the same time and with the same magnitude. The following stages indicate how the IED's calculate the current differential and compare the results at least two times within about a 200 msec time window to reach a final result. The positive sequence current is used in this to keep the GOOSE traffic to a minimum, individual phase measurements can be used if desired. This is the first and only stage that measured values are used. The direction is assumed to be non critical in this radial application. Direction is determined by each IED to be forward or reverse through the system topology. The directional measurement acts as an inverter of the measured value should the direction change. This function is used in non radial systems.

Stage 1:

The GOOSE value from the remote IED is now subtracted from the locally measured current. The difference value should be less than the expected load ($I_{diff}$ set) in this line section. If this is true the IED will issue a binary 0 value. The remote IED will perform the exact same calculation as described above. Each IED will then issue a binary 0 value for $I_{diff}$. In Table 1a we reach a binary 0 result in both relays.

Stage 2:

In this stage the differential results $I_{diff}$ or stage 1 is compared between the two IED's. Each IED will compare its $I_{diff}$ result to that of the other $I_{diff}$ from the received GOOSE. If either of the $I_{diff}$ values are 0 this stage will issue a 0 as a result. In Table 1a we reach a binary 0 result in both relays.

Stage 3:

In this stage the stage 2 results are compared between the two IED's. Each IED will compare its stage 2 result to that of the other IED's received GOOSE. If either of the stage 2 values are 0 this stage will issue a 0 as a result. A zero result indicate a no fault situation. In table 1a we reach a binary 0 result in both relays.

TABLE 1b

| Stable Zone 1-2 (Note: >> indicates a GOOSE value, PJ = Postive Jump, NJ = Negative Jump) | | |
|---|---|---|
| Stage | F1 | F2 |
| Stage 1 (RMS value of the phase currents used) | Iph a (measured) F1aPJ = Ia > ΔIt pos = +1 And F1aNJ = Ia < ΔIt neg = 0 | Iph a (measured) F2aPJ = Ia > ΔIt pos = +1 And F2aNJ = Ia < ΔIt neg = 0 |
| Stage 2 (binary 1 or 0) | Compare PJ F1 and >>NJ F2 If F1aPJ = 1 AND >>F2aNJ = 1 then 1 = F1a diff fault 1-2 F1aPJ AND >>F2aNJ = 1 AND 0 = 0 (1 = F1a diff fault 1-2)) No Diff Fault | Compare PJ F2 and >>NJ F1 F2aPJ AND >>F1aNJ If F2aPJ = 1 AND >>F1aNJ = 1 then 1 = F2a diff fault 2-1 F2aPJ AND >>F1aNJ 1 AND 0 = 0 (1 = F2a diff fault 2-1) No Diff Fault |
| Stage 3 (binary 1 or 0) | Compare F1a Diff Fault 1-2 and >>F2a Diff Fault 2-1 If F1a Diff F1-2 = 1 AND >>F2a Diff F2-1 = 1 then Diff Fault 1-2 0 AND 0 = 0 = F1a Diff Fault 1-2 = No Diff Fault | Compare F2 a Diff Fault 2-1 and >>F1a Diff Fault 1-2 If F2a Diff F2-1 = 1 AND >>F1a Diff F1-2 = 1 then Diff Fault 1-2 0 AND 0 = 0 = F1a Diff Fault 1-2 = No Diff Fault |

Table 1b Description:

The table describes the jump detector method to identify a faulted line section. The method shares only binary GOOSE information between IED's to get to a final result. The method is not affected by the direction of current as long as only 1 source is connected to the feeder. This method comprises a local measurement to detect a sudden change or jump in current in both positive or negative direction. These jumps are sent to the adjacent IED's via GOOSE for processing. Each jump will only be active for a predetermined time as a pulse. Two IED's must agree during this pulse period that a fault is present.

Stage 1:

In this stage each IED measures the phase currents for a positive jump or current increase and a negative jump or current decrease that is more than the preset $\Delta I_t$ value. Should the jump be more than the $\Delta I_t$ value, a 1 or 0 binary value is generated for both the positive jump and negative jumps. These two jump indicators are pulse outputs and will remain high for a preset time. In Table 1b we reach a binary 1 for positive jumps in both relays and binary 0 result in both IED's for negative jumps.

Stage 2:

In this stage the positive and negative jump information is compared through an AND function. The positive jump and negative jump signals form the local IED and the remote IED are put through two AND gates. The AND gates will produce a binary 1 if there is local positive jump AND a remote negative jump, OR a local negative jump AND a remote positive jump. This signal indicates a diff fault present as measured at either IED. In Table 1b we reach a binary 0 result in both relays.

Stage 3:

In this stage the stage 2 final output signals are used in an AND function to finally determine the presence of a diff fault. If both IED's agree that a fault is present a final Diff Fault for the line section is issued by both devices. In Table 1b we reach a binary 0 result in both relays thus no fault.

For a faulted zone as between F2 and F3 in FIG. 1 and with reference to FIG. 2, the following tables represent the sequence of steps:

TABLE 2a

Faulted Zone 2-3 (Note: >> indicates a GOOSE value PU = per unit)

| Stage | F2 | F3 |
|---|---|---|
| Stage 1 (RMS value of the Zero sequence current used) | Idiff for F2-3 = I2->>I3 = (1PU − 0PU) > Idiff set (+ OR −) = 1 | Idiff for F3-2 = I3->>I2 = (0PU − 1PU) > Idiff set (+ OR −) = 1 |
| Stage 2 (binary 1 or 0) | F2-3 AND F3-2 (goose) = 1 AND >>1 = 1 (Zone fault) | F3-2 AND F2-3 (goose) = 1 AND >>1 = 1 (Zone fault) |
| Stage 3 (binary 1 or 0) | Faulted Zone = 1 AND >>1 = 1 (1 = Fault) | Faulted Zone = 1 AND >>1 = 1 (1 = Fault) |

Table 2a Description:

This table describes the how the IED's will react to a fault inside the zone of protection. In this instance the current measured in one IED will increase and at the same time the current at the other IED will decrease. The current will flow into the actual fault and not reach this IED at position 3. The following stages indicate how the IED's calculate the current differential and compare the results at least two times within a 200 msec time window to reach a final result. The positive sequence current is used in this to keep the GOOSE traffic to a minimum, individual phase measurements can be used if desired. Preferably, this is the first and only stage that measured values are used. The direction is assumed to be non critical in this radial application. Direction is determined by each IED to be forward or reverse through the system topology. The directional measurement act as an inverter of the measured value should the direction change. This function is used in non radial systems.

Stage 1:

The GOOSE value from the remote IED is now subtracted from the locally measured current. The difference value should be less than the expected load ($I_{diff}$ set) in this line section. If this is false the IED will issue a binary 1 value. The remote IED will perform the exact same calculation as described above. Each IED will then issue a binary 1 value for $I_{diff}$. In Table 2a we reach a binary 1 result in both relays.

Stage 2:

In this stage the differential results $I_{diff}$ or stage 1 is compared between the two IED's. Each IED will compare its $I_{diff}$ result to that of the other $I_{diff}$ from the received GOOSE. If both of the $I_{diff}$ values are 1 this stage will issue a 1 as a result. In Table 2a we reach a binary 1 result in both relays.

Stage 3:

In this stage the stage 2 results are compared between the two IED's. Each IED will compare its stage 2 result to that of the other IED's received GOOSE. If both of the stage 2 values are 1 this stage will issue a 1 as a result. A 1 result indicates a fault situation. In Table 2a we reach a binary 1 result in both relays.

TABLE 2b

Faulted Zone 2-3 (Note: >> indicates a GOOSE value)

| Stage | F2 | F3 |
|---|---|---|
| Stage 1 (RMS value of the phase currents used) | Iph a (measured) F2aPJ = Ia > ΔIt pos = +1 And F2aNJ = Ia < ΔIt neg = 0 | Iph a (measured) F3aPJ = Ia > ΔIt pos = 0 And F3aNJ = Ia < ΔIt neg = 1 |
| Stage 2 (binary 1 or 0) | Compare PJ F2 and >>NJ F3 If F2aPJ = 1 AND >>F3aNJ = 1 then 1 = F1a diff fault 1-2 F2aPJ AND >>F3aNJ = 1 AND 1 = 1 (1 = F1a diff fault 1-2)) Diff Fault detected | Compare PJ F3 and >>NJ F2 F3aPJ AND >>F2aNJ If F3aPJ = 1 AND >>F2aNJ = 1 then 1 = F3a diff fault 2-1 F3aPJ AND >>F2aNJ 1 AND 1 = 1 (1 = F2a diff fault 2-1) Diff Fault detected |
| Stage 3 (binary 1 or 0) | Compare F2 a Diff Fault 2-3 and >>F2a Diff Fault 3-2 If F1a Diff F2-3 = 1 AND >>F2a Diff F3-2 = 1 then Diff Fault 2-3 1 AND 1 = 1 = F1a Diff Fault 2-3 = Diff Fault | Compare F2 a Diff Fault 3-2 and >>F1a Diff Fault 2-3 If F2a Diff F3-2 = 1 AND >>F1a Diff F2-3 = 1 then Diff Fault 2-3 1 AND 1 = 1 = F1a Diff Fault 1-2 = Diff Fault |

Table 2b Description:

The table describes the jump detector method to identify a faulted line section. The method shares only binary GOOSE information between IED's to get to a final result. The method is not affected by the direction of current as long as only 1 source is connected to the feeder. This method comprises a local measurement to detect a sudden change or jump in current in both positive or negative direction. These jumps are sent to the adjacent IED's via GOOSE for processing. Each jump will only be active for a predetermined time as a pulse. Two IED's must agree during this pulse period that a fault is present.

Stage 1:

In this stage each IED measures the phase currents for a positive jump or current increase and a negative jump or current decrease that is more than the preset $\Delta I_t$ value. Should the jump be more than the $\Delta I_t$ value, a 1 or 0 binary value is generated for both the positive jump and negative jumps. These two jump indicators are pulse outputs and will remain high for a preset time. In Table 2b we get for F2 a binary 1 for a positive jump and a binary 0 for the negative jump and in F3 we get a binary 0 for a positive jump and a binary 1 for the negative jump.

Stage 2:

In this stage the positive and negative jump information is compared through an AND function. The positive jump and negative jump signals form the local IED and the remote IED are put through two AND gates. The AND gates will produce a binary 1 if there is local positive jump AND a remote negative jump, OR a local negative jump AND a remote positive jump. This signal indicates a diff fault present as measured at either IED. In Table 2b we reach a binary 1 result in both relays.

Stage 3:

In this stage the stage 2 final output signals are used in an AND function to finally determine the presence of a differential fault. If both IED's agree that a fault is present a final Diff Fault for the line section is issued by both devices. In Table 2b we reach a binary 1 result in both relays thus differential fault detected.

Upon detecting a fault in this example, F2 and F3 breakers can be opened to isolate the fault.

Peer-to-peer messages are used to distribute the RMS values to local differential equations and stage status information.

The testing method can also be used to act as a permissive tripping scheme to allow faster disconnection for low current or high impedance faults. Moreover, broken conductor detection can also be used to disable the differential function if desired.

While the invention is described in terms of several preferred embodiments, it will be appreciated that the invention is not limited to circuit interrupting and disconnect devices. The inventive concepts may be employed in connection with any number of devices including circuit breakers, reclosers, and the like. When faults are detected, breakers are tripped, alarm indications are sent to system control, or other protection schemes may be initiated.

Logic units utilized in an overall system for microprocessor based protective devices as known in the art may include input transformers, low-pass filters, sample-hold amplifiers, multiplexers, programmable gain amplifiers, A/D converters, and the like.

Peer-to-Peer communication (such as generic-object-oriented substation event (GOOSE) messages of the IEC 61850 standard) enables distribution relays to communicate with others connected to the communication network without having a master device. As such, any relay can reconfigure the distribution system after a fault occurs depending on programming. Any of a number of peer-to-peer communication schemes are contemplated herein.

Computer program code for carrying out operations of the invention described above may be written in a variety of languages for development convenience. For example, PLCs may be programmed using application software on personal computers, using standards-based programming languages (e.g., IEC 61131-3). The programming software allows entry and editing of the ladder-style logic (Ladder Logic Diagram Programming). The functionality of the PLC includes, for example, sequential relay control, motion control, process control, distributed control systems and networking. In certain instances, PLRs (programmable logic relays) may be used. In addition, computer program code for carrying out operations of embodiments of the present invention may also be written in other programming languages such as a dialect that resembles BASIC or C or other programming language with bindings appropriate for a real-time application environment.

Code in which a program of the present invention is described can be included as a firmware in a RAM, a ROM and a flash memory. Otherwise, the code can be stored in a tangible computer-readable storage medium such as a magnetic tape, a flexible disc, a hard disc, a compact disc, a photo-magnetic disc, DVD. The present invention can be configured for use in a computer or an information processing apparatus which includes a memory, such as a central processing unit (CPU), a RAM and a ROM as well as a storage medium such as a hard disc.

The "step-by-step process" for performing the claimed functions herein is a specific algorithm and is shown in the text of the specification as prose and/or in the flow charts. The instructions of the software program create a special purpose machine for carrying out the particular algorithm. In any means-plus-function claim herein in which the disclosed structure is a computer, or microprocessor, programmed to carry out an algorithm, the disclosed structure is not the general purpose computer, but rather the special purpose computer programmed to perform the disclosed algorithm.

A general purpose computer, or microprocessor, may be programmed to carry out the algorithm/steps of the present invention creating a new machine. The general purpose computer/microprocessor becomes a special purpose computer once it is programmed to perform particular functions pursuant to instructions from program software of the present invention. The instructions of the software program that carry out the algorithm/steps electrically change the general purpose computer/microprocessor by creating electrical paths within the device. These electrical paths create a special purpose machine for carrying out the particular algorithm/steps.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A method of detecting faults in a power distribution system having at least one source coupled to a distribution line comprising a plurality of fault protection devices segmenting the distribution line into a plurality of protected zones, the fault protection devices having processing and communication capabilities and associated with switching devices, the method comprising, for each protected zone defined by a pair of fault protection devices on either end, a first local fault protection device on a first end and a second remote fault protection device on a second end:

(a) receiving as input a local root mean square (RMS) value of a positive sequence current $I_1$ of the first local fault protection device and a remote RMS value of the positive sequence current $I_2$ of the second remote fault protection device, wherein the RMS values are communicated between the fault protection devices via event messages;

(b) determining for each fault protection device of the pair a current differential between current $I_1$ and current $I_2$ to set a binary value for each fault protection device of the pair based on a measured minimum positive sequence current setting;

(c) setting individually for each fault protection device a first stage status of binary 0 if the current differential is less than an expected load ($I_{diff}$ set) in this zone, else setting the first stage status as a binary 1;

(d) communicating between each fault protection device via event messages the first stage statuses and then comparing the first stage statuses wherein if either fault protection device has the first stage status of binary 0, setting individually for each fault protection device a second stage status as binary 0, else setting the second stage status as a binary 1;

(e) communicating between each fault protection device via event messages the second stage statuses and then comparing the second stage statuses wherein if either fault protection device has the second stage status of binary 0, setting individually for each fault protection device a final status as binary 0, else setting the final status as a binary 1; and (f) indicating a no fault situation if both the final statuses are binary 0, else indicating a fault.

2. The method of claim 1, further comprising outputting to one or more associated automatic switches or reclosers a command to initiate an event leading to tripping the circuit if the fault is indicated.

3. The method of claim 1, wherein the communication capabilities comprise a peer-to-peer communications channel.

4. The method of claim 1, wherein the event messages are generic-object-oriented substation event (GOOSE) messages.

5. The method of claim 1 further comprising, upon indicating the fault on the segment of the distribution line, operating the fault protection device to isolate the fault from the source.

6. The method of claim 1 further comprising, upon indicating the fault on the segment of the distribution line, closing a normally open device to couple an alternate source to the distribution line.

7. The method of claim 1 wherein the comparing of the first and second stage statuses are completed within approximately a 200 msec time window.

8. A non-transitory computer-readable media comprising instructions that when executed by a processor implement the steps of claim 1.

9. A fault protection system in a power distribution system having at least one source coupled to a distribution line, comprising:
a plurality of fault protection devices segmenting the distribution line into a plurality of protected zones, each protected zone defined by a pair of fault protection devices on either end, a first local fault protection device on a first end and a second remote fault protection device on a second end, the fault protection devices having a processor and communication means and associated with switching devices, wherein each fault protection device is adapted to:
(a) receive as input a local root mean square (RMS) value of a positive sequence current $I_1$ of the first local fault protection device and a remote RMS value of the positive sequence current $I_2$ of the second remote fault protection device, wherein the RMS values are communicated between the fault protection devices via event messages;
(b) determine for each fault protection device of the pair a current differential between current $I_1$ and current $I_2$ to set a binary value for each fault protection device of the pair based on a measured minimum positive sequence current setting;
(c) set individually for each fault protection device a first stage status of binary 0 if the current differential is less than an expected load ($I_{diff}$ set) in this zone, else setting the first stage status as a binary 1;
(d) communicate between each fault protection device via event messages the first stage statuses and then compare the first stage statuses wherein if either fault protection device has the first stage status of binary 0, setting individually for each fault protection device a second stage status as binary 0, else setting the second stage status as a binary 1;
(e) communicate between each fault protection device via event messages the second stage statuses and then compare the second stage statuses wherein if either fault protection device has the second stage status of binary 0, setting individually for each fault protection device a final status as binary 0, else setting the final status as a binary 1; and
(f) output a no fault situation if both the final statuses are binary 0, else output a fault.

10. The system of claim 9, wherein the event messages are generic-object-oriented substation event (GOOSE) messages.

11. A fault protection system in a power distribution system, comprising:
a plurality of fault protection devices segmenting a distribution line into a plurality of protected zones, each protected zone defined by a pair of fault protection devices, a first fault protection device on a first end and a second fault protection device on a second end, the fault protection devices having a processor and communication capabilities, wherein each fault protection device is adapted to:
receive as input a value representing a current $I_1$ of the first fault protection device and a value representing a current $I_2$ of the second fault protection device, wherein the values are communicated between the fault protection devices via event messages;
determine for each fault protection device of the pair a current differential between current $I_1$ and current $I_2$ to set a binary value for each fault protection device of the pair;
set for each fault protection device a first stage status of a first binary value if the current differential is less than an expected load, else setting the first stage status as a second binary value;
communicate between each fault protection device via event messages the first stage statuses and then compare the first stage statuses wherein if either fault protection device has the first stage status of the first binary value, setting for each fault protection device a second stage status as the first binary value, else setting the second stage status as the second binary value;
communicate between each fault protection device via event messages the second stage statuses and then compare the second stage statuses wherein if either fault protection device has the second stage status of the first binary value, setting for each fault protection device a final status as the first binary value, else setting the final status as the second binary value; and
output a no fault situation if both the final statuses are the first binary value, else output a fault.

12. The system of claim 11, wherein the event messages are generic-object-oriented substation event (GOOSE) messages.

13. The system of claim 11, wherein the communication capabilities comprise a peer-to-peer communications channel.

14. The system of claim 11, wherein the fault protection devices are associated with switching devices.

15. The system of claim 11, wherein the values respectively representing current $I_1$ and current $I_2$ are RMS values.

16. The system of claim 11, wherein the first binary value is binary 0 and the second binary value is binary 1.

17. The system of claim 11, wherein the first fault protection device is a local fault protection device and the second fault protection device is a remote fault protection device.

18. The system of claim 11, wherein the comparing of the first and second stage statuses are completed within approximately a 200 msec time window.

19. The system of claim 11, wherein upon a fault output, at least one of the fault protection devices operates to isolate the fault from a power source.

20. The system of claim 11, wherein upon a fault output, at least one of the fault protection devices operates to close a normally open device to couple an alternate power source to the distribution line.

\* \* \* \* \*